United States Patent
Kosaka et al.

(10) Patent No.: US 7,713,847 B2
(45) Date of Patent: May 11, 2010

(54) METHOD FOR FORMING ALGAN CRYSTAL LAYER

(75) Inventors: Kei Kosaka, Nagoya (JP); Shigeaki Sumiya, Handa (JP); Tomohiko Shibata, Akita (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/051,168

(22) Filed: Mar. 19, 2008

(65) Prior Publication Data

US 2008/0242060 A1    Oct. 2, 2008

(30) Foreign Application Priority Data

Mar. 29, 2007  (JP)  ............................. 2007-088219

(51) Int. Cl.
*H01L 21/20* (2006.01)
*H01L 21/36* (2006.01)

(52) U.S. Cl. .................. 438/478; 438/492; 438/493; 257/77; 257/190; 257/E29.104; 257/E21.108

(58) Field of Classification Search ................ 257/103, 257/14, 77, 190, E29.104, E29.091, E21.09, 257/E21.108; 438/478, 493

See application file for complete search history.

(56) References Cited

U.S. PATENT DOCUMENTS

| | | | |
|---|---|---|---|
| 2006/0175600 A1* | 8/2006 | Sato et al. | 257/14 |
| 2006/0263923 A1* | 11/2006 | Alfano et al. | 438/48 |
| 2007/0101932 A1* | 5/2007 | Schowalter et al. | 117/952 |
| 2007/0120141 A1* | 5/2007 | Moustakas et al. | 257/103 |

\* cited by examiner

*Primary Examiner*—Fernando L Toledo
*Assistant Examiner*—Mamadou Diallo
(74) *Attorney, Agent, or Firm*—Burr & Brown (57) ABSTRACT

A method for preparing an AlGaN crystal layer with good surface flatness is provided. A surface layer of AlN is epitaxially formed on a c-plane sapphire single crystal base material by MOCVD method, and the resulting laminated body is then heated at a temperature of 1300° C. or higher so that a template substrate applying in-plane compressive stress and having a surface layer flat at a substantially atomic level is obtained. An AlGaN layer is formed on the template substrate at a deposition temperature higher than 1000° C. by an MOCVD method that includes depositing alternating layers of a first unit layer including a Group III nitride represented by the composition formula $Al_xGa_{1-x}N$ ($0 \leq x \leq 1$) and a second unit layer including a Group III nitride represented by the composition formula $Al_yGa_{1-y}N$ ($0 \leq y \leq 1$ and $y \neq x$) such that the AlGaN layer has a superlattice structure.

9 Claims, 4 Drawing Sheets

| SAMPLE NO. | 1 | 2 | 3 | 4 | 5 | 6 |
|---|---|---|---|---|---|---|
| HEAT TREATMENT OF TEMPLATE | PRESENT | PRESENT | PRESENT | PRESENT | PRESENT | ABSENT |
| SUPERLATTICE STRUCTURE | ○ | ○ | ○ | ○ | × | ○ |
| AlGaN LAYER DEPOSITION TEMPERATURE | 1000°C | 1025°C | 1050°C | 1075°C | 1050°C | 1050°C |
| FORMATION OF MIRROR SURFACE | ○ | ○ | ○ | ○ | × | ○ |
| SURFACE CRACKING | ABSENT | ABSENT | ABSENT | ABSENT | ABSENT | PRESENT |
| SURFACE ROUGHNESS ra | 2nm | 2nm | 1nm | 2nm | 10 nm OR MORE | 1nm |
| SURFACE PITS | PRESENT | ABSENT | ABSENT | ABSENT | ABSENT | ABSENT |

METHOD FOR FORMING ALGAN CRYSTAL LAYER

BACKGROUND OF THE INVENTION

1. Field of the Invention

The invention relates to techniques for forming an AlGaN crystal layer on a template substrate.

2. Description of the Background Art

There is a known technique for fabricating a template substrate (epitaxial substrate) that may be used as a base substrate in the process of epitaxially forming a Group III nitride crystal layer (see for example Japanese Patent Application Laid-Open (JP-A) No. 2006-332570).

It is also known that a diode structure-type light-emitting device having an emission wavelength in the ultraviolet region is obtained by forming a light-emitting layer or an n-type or p-type conductive layer of high-Al-content $Al_xGa_{1-x}N$ ($x \geq 0.4$) (see for example "III-Nitride UV Devices," M. Asif Khan, M. Shatalov, H. P. Maruska, H. M. Wang, and E. Kuokstis, Jpn. J. Appl. Phys., Vol. 44, No. 10, 2005, pp. 7191-7206).

In order to prepare a light-emitting device having an emission wavelength in the deep ultraviolet region as disclosed in the article of Khan et al., it is necessary to form laminations of a plurality of crystal layers made of high-Al-content $Al_xGa_{1-x}N$ ($x \geq 0.4$) on a single crystal substrate of sapphire or SiC. In order to obtain the light-emitting device with good characteristics, the lamination should be formed in a good manner, and therefore each crystal layer is required to have a good surface flatness.

JP-A No. 2006-332570 discloses that a template substrate having a crystal layer with improved surface flatness can be obtained by a process that includes forming a crystal layer made of Group III nitride such as an AlN as a surface layer on a single crystal base material and then performing a heat treatment at a temperature higher than the temperature at which the crystal layer is formed. However, the inventors have found that when an AlGaN layer is formed using a template substrate having the AlN surface layer, the resulting AlGaN layer does not always have a good surface flatness, although it has a good crystallinity.

In addition, the article of Khan et al. also discloses an aspect that in order to prevent cracking, a multilayered buffer layer is formed before the high-Al-content AlGaN layer is formed. In this case, however, crystal layers having a good surface flatness also cannot be obtained.

SUMMARY OF THE INVENTION

The invention is intended for a method of forming an AlGaN crystal layer on an AlN template substrate.

A first aspect of the present invention is directed to a method of forming an AlGaN crystal layer, including the steps of fabricating a template substrate by forming an AlN layer having a surface being flat at a substantially atomic level on a specific single crystal base material, and forming an AlGaN layer on the AlN layer, wherein the AlGaN layer is formed at a deposition temperature higher than 1000° C. by depositing alternating layers of a first unit layer including a Group III nitride represented by the composition formula $Al_xGa_{1-x}N$ ($0 \leq x \leq 1$) and a second unit layer including a Group III nitride represented by the composition formula $Al_yGa_{1-y}N$ ($0 \leq y \leq 1$ and $y \neq x$) such that the AlGaN layer has a superlattice structure.

Accordingly, an AlGaN layer having a flat at a substantially atomic level can be obtained.

Preferably, the first unit layer and the second unit layer are each formed with a thickness in such a range that no lattice relaxation occurs.

Accordingly, the AlGaN layer can be formed while the first and second unit layers can be coherently grown. Therefore, the resulting AlGaN layer can have an in-plane lattice constant substantially the same as that of the AlN layer of the template substrate and have a surface that is flat at a substantially atomic level.

It is therefore an object of the invention to provide a method for fabricating a high-Al-content AlGaN crystal layer with a good surface flatness.

DETAILED DESCRIPTION OF THE INVENTION

<Outline>

Figure 1:
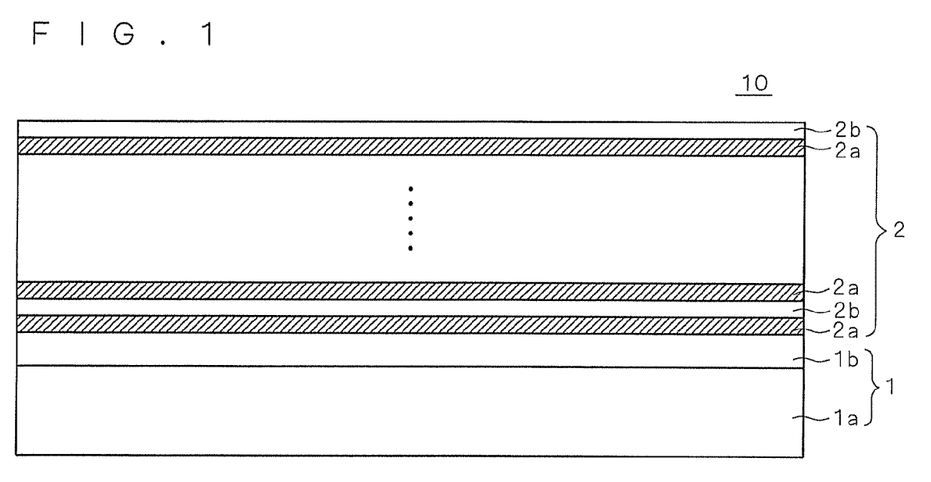
FIG. 1 is a schematic cross-sectional view of a laminated body 10.

FIG. 1 is a schematic cross-sectional view of a laminated body 10 that is produced using a method according to an embodiment of the present invention. The laminated body 10 is simplistically shown as a structure that can be a component of various devices such as light-emitting devices and light-receiving devices.

The method according to this embodiment is a method of forming a crystal layer 2 made of AlGaN (hereinafter, referred to as AlGaN layer) on a template substrate 1 which serves as a backing substrate and has a surface being flat at a substantially atomic level so that the AlGaN layer has good surface flatness. In this embodiment, the AlGaN layer 2 is formed so as to have a superlattice structure on the template substrate 1 as a base substrate. This realizes the AlGaN layer 2 having good surface flatness. For the sake of convenience, the ratio between the thicknesses of the respective layers and the aspect ratio shown in FIG. 1 do not reflect the true ratios.

<Template Substrate>

In this embodiment, the template substrate 1 used has a structure including a base material 1a made of a specific single crystal and a surface layer 1b made of AlN and formed thereon. This is not intended to exclude the use of template substrates other than that of this structure. Any other template substrate may also be used, including a template substrate having a surface layer equivalent to the surface layer 1b of the template substrate 1, specifically a template substrate having a dislocation density substantially equal to or lower than that of the surface layer 1b and having surface flatness substantially equal to or better than that of the surface layer 1b.

The base material 1a is appropriately selected depending on the composition or structure of the surface layer 1b to be formed thereon, and moreover, depending on the method for further forming the crystal layer thereon. For example, a SiC (silicon carbide) substrate, a sapphire substrate or the like may be used as the base material. Alternatively, the single crystal to be used may be appropriately selected from single crystals of various oxide materials such as ZnO, LiAlO$_2$, LiGaO$_2$, MgAl$_2$O$_4$, (LaSr)(AlTa)O$_3$, NdGaO$_3$, and MgO; single crystals of various Group IV elements such as Si and Ge; single crystals of various Group IV-IV compounds such as SiGe; single crystals of various Group III-V compounds such as GaAs, AlN, GaN, and AlGaN; and single crystals of various boron compounds such as ZrB$_2$. The thickness of the base material 1a is not particularly limited by material. In view of handleability, it is preferably from several hundreds micrometers to several millimeters.

For optical device applications in the ultraviolet region, materials transparent to the operation wavelength are preferably used. In view of compatibility with the crystal structure of Group III nitrides, sapphire is the most preferable as the base material 1a. In addition, for high-power optical device applications, electronic device applications requiring heat radiation, or the like, SiC is the most preferable because of its high thermal conductivity. A material that does not decompose at high temperature should be used depending on the setting temperature of the heat treatment temperature for such thin film production.

In the present embodiment, a description is given in the case where c-plane sapphire is used as the base material 1a. As described above, however, the base material 1a is not limited to such a material in any way.

The surface layer 1b is generally an epitaxial film made of a Group III nitride crystal formed by a known film forming techniques such as an MOCVD method, an MBE method, an HVPE (a vapor phase epitaxy using a hydride), a sputtering method, and nitriding treatment of the base material. As used herein, the term "Group III nitride crystal" is a crystal represented by the composition formula: $B_xAl_yGa_zIn_{1-x-y-z}N$ (x, y, z≧0) and having a wurtzite structure or a zinc blend structure. The MOCVD method may be used in combination with a PALE (pulsed atomic layer epitaxy) method, a plasma assisted method or a laser assisted method. The MBE method may also be used in combination with the same technique. The growth method such as the MOCVD or MBE method is suited to grow high-quality crystals, because the manufacturing conditions can be precisely controlled. On the other hand, the HVPE method is suited to grow thick films in a short time, because it allows the supply of a large amount of raw materials at once. Upon forming the surface layer 1b, these methods may also be used in combination.

The thickness of the surface layer 1b is not particularly limited and may be selected to be optimal for the structure or use mode of the device being finally applied. For example, it is assumed that the thickness may be from several nanometers to several millimeters. In a preferred example, the surface layer is formed with a thickness of several micrometers. In addition, the composition of the surface layer 1b is not necessarily required to be uniform over the layer. For example, the surface layer may have a gradient composition, or a stress relaxation layer with a different composition may be incorporated in the surface layer.

Moreover the surface layer 1b may contain an impurity inevitably included in the process of forming the surface layer 1b, such as H, C, O, Si, and a transition metal, or may contain an impurity intentionally introduced for electrical conductivity control, such as Si, Ge, Be, Mg, Zn, and Cd.

In the present embodiment, a description is given of an example where the surface layer 1b made of AlN is formed by an MOCVD method. The detail of the formation method will be described later. A template substrate 1 obtained by forming a single crystal layer made of AlN as a surface layer 1b on the base material 1a at a substrate temperature of 1100° C. or higher by an MOCVD method is subjected to a heat treatment. The resulting one is used as a base substrate upon forming the AlGaN layer 2.

Such heat treatment is performed so as to improve the crystal quality of the surface layer 1b formed on the base material 1a using the regularity of the crystal alignment of the base material 1a, which is a single crystal. Therefore, it is preferred that the base material 1a should not decompose or melt in the temperature range of the heat treatment carrying out for the improvement of the crystal quality or should not strongly react with the Group III nitride crystal that forms the surface layer 1b, because it is necessary to avoid disturbing the crystal alignment of the base material 1a during the heat treatment. Therefore, it is preferred that a reaction product between the base material 1a and the surface layer 1b should not be significantly formed at the interface therebetween during the heat treatment. Specifically, a reaction product is not significantly formed means that the reaction product is not present at all at the interface therebetween after the heat treatment or even if present, the thickness of the reaction product is at most ¹/₁₀ or less of the thickness of the surface layer 1b. If the thickness of the reaction product is more than such a value, there is a possibility that the existing reaction product could degrade the surface flatness of the surface layer 1b. Therefore, overall or localized formation of a very thin reaction product at the interface between the base material 1a and the surface layer 1b by heat treatment is not excluded from the scope of the invention. In some cases, such a very thin reaction product may preferably be present, because it can play a role as a buffer layer for a reduction in dislocation or the like. From this point of view, sapphire, MgO or SiC having a high melting point is preferable as the base material 1a.

The heat treatment is also particularly effective in reducing dislocation or eliminating pits on the surface. For example, the dislocation density can be reduced to about ½ or less. In particular, an edge dislocation can be effectively incorporated and eliminated. As described later, the dislocation in the surface layer 1b should preferably be reduced as much as possible, in forming the AlGaN layer 2 with good surface flatness by the method according to this embodiment. In this point of view, the heat treatment of the template substrate 1 is also effective.

After the heat treatment, the surface of the template substrate 1 (namely the surface of the surface layer 1b) is visually observed as a mirror surface with no cracks and has a good surface flatness at a substantially atomic level in such a degree that the surface roughness ra of a 5 square micrometers area is several nanometers or so in the measurement with an AFM (atomic force microscope).

Here, it has been confirmed that the in-plane lattice constant of AlN is smaller in the surface layer 1b after the heat treatment than in an ideal state with no stress, namely that in-plane compressive stress is applied to the surface layer. Thus, the AlGaN layer 2 is formed under the in-plane compressive stress, which may act to suppress a generation of cracking of the AlGaN layer 2. Using the template substrate 1 under such stress makes the formation of the crack-free AlGaN layer 2 more reliable. However, it is not intended that the composition of the surface layer 1b is not limit to AlN. Any other material may also be used to form the surface layer 1b, as long as the resulting surface layer 1b can have characteristics substantially the same as or higher than those of the AlN layer with respect to surface flatness, dislocation density and the state of stress.

<AlGaN Layer>

The AlGaN layer 2 includes a superlattice structure having alternating layers of a first unit layer 2a made of a Group III nitride represented by the composition formula $Al_xGa_{1-x}N$ ($0 \leq x \leq 1$) and a second unit layer 2b made of a Group III nitride represented by the composition formula $Al_yGa_{1-y}N$ ($0 \leq y \leq 1$).

The composition of each of the first unit layer 2a and the second unit layer 2b may be appropriately determined depending on the desired function of the AlGaN layer 2. For example, when the AlGaN layer 2 is formed as a functional layer for a light-emitting device having an emission wavelength in the ultraviolet region, the first unit layer 2a is preferably made of a Group III nitride represented by the composition formula $Al_xGa_{1-x}N$ ($0.5 < x \leq 1$), and the second unit layer 2b is preferably made of a Group III nitride represented by the composition formula $Al_yGa_{1-y}N$ ($0.5 \leq y < 1$ and $y < x$).

The AlGaN layer 2 is formed on the template substrate 1 by MOCVD method. Each of the first unit layer 2a and the second unit layer 2b is preferably formed with a thickness in such a range that lattice relaxation will not occur in the first unit layer 2a and the second unit layer 2b. In other words, the AlGaN layer is formed while the first unit layer and the second unit layer can be coherently grown. Such a process allows the production of an AlGaN layer 2 which has an in-plane lattice constant substantially equal to that of the surface layer 1b and whose surface is flat at a substantially atomic level. The number of repetitions of each layer may be appropriately determined depending on the desired function of the AlGaN layer 2. In a preferred embodiment, for example, the AlGaN layer 2 is formed with a total thickness of several micrometers by depositing several tens to several hundreds of alternating layers of the first unit layer 2a and the second unit layer 2b each with a thickness of several to tens of nanometers.

The AlGaN layer 2 is preferably formed at a deposition temperature higher than 1000° C. This allows the formation of an AlGaN layer 2 having good surface flatness. For example, the AlGaN layer 2 may be formed such that the surface thereof is visually observed as a mirror surface with no cracks and has good surface flatness in such a degree that the surface roughness ra of a 5 square micrometers area is several nanometers or so in the measurement with an AFM (atomic force microscope). However, it has been found that when the AlGaN layer 2 is formed at a deposition temperature lower than 1025° C., pits can be formed on the surface of the AlGaN layer 2. At a deposition temperature of 1025° C. or higher, the AlGaN layer 2 can be formed with higher surface flatness and with very few pits observed.

If the deposition temperature is 1100° C. or higher, the surface roughness can be worsened. Therefore, the deposition temperature is preferably lower than 1100° C.

The AlGaN layer 2 may be appropriately doped with an acceptor element or a donor element so as to have p-type or n-type conductivity. When the AlGaN layer 2 is doped with a dopant of Si to have n-type conductivity, the deposition temperature is also preferably lower than 1100° C. In this case, the AlGaN layer 2 can be formed with good electrical conductivity. When the AlGaN layer 2 with such electrical conductivity is required to offer higher conducting performance, the deposition temperature should preferably set at 1025° C. or higher and 1060° C. or less.

<Process of Forming AlGaN Layer>

Next, a description is given of the process of forming the AlGaN layer having good surface flatness as described above. In this section, a description is given of a case where the template substrate 1 consists of a c-plane sapphire single crystal as the base material 1a and an AlN layer as the surface layer 1b.

At first, the template substrate 1 is obtained. The template substrate 1 may be prepared by a known technique. For example, about several hundreds μm c-plane sapphire single crystal is provided as the base material 1a, placed at a specific position in an MOCVD apparatus, and heated at a temperature of 1100° C. or higher, then TMA (trimethylaluminum) and ammonia gas are supplied in a specific flow ratio together with hydrogen carrier gas, so that an AlN layer with a thickness of several μm is formed. In the description below, the term "temperature" refers to the temperature of the base material 1a.

In a known heat-treatment furnace, the laminated body of the base material 1a and the AlN layer is then heated to a temperature of 1500° C. or higher. The heating may be performed in the MOCVD apparatus. The heat treatment allows the formation of a surface layer 1b to which in-plane compressive stress is applied and whose surface has a substantially atomic level of flatness. As a result, the template substrate 1 is obtained.

The heat treatment is preferably performed in a temperature range not higher than the melting point of the base material 1a or in a temperature range where a reaction product is not remarkably formed between the base material 1a and the surface layer 1b, namely in a temperature range where crystal degradation of the surface layer 1b due to an excessive reaction does not occur. In this embodiment, a c-plane sapphire is used as the base material 1a, and the surface layer 1b is formed of AlN. Therefore, the heat treatment is preferably performed in a temperature range where γ-ALON is not significantly formed at the interface between them. If γ-ALON is significantly formed, the surface of the surface layer 1b can be roughened so that it can be difficult to form a high-surface-flatness AlGaN layer 2.

Regarding an atmosphere during the heat treatment, it is preferable that the atmosphere contains nitrogen element in order to prevent the decomposition of AlN. For example, an atmosphere containing nitrogen gas or ammonia gas may be used. Regarding pressure conditions at the time of the heat treatment, it has been confirmed that any pressure from reduced pressure to increased pressure may be used to improve the crystal quality of the AlN layer.

The AlGaN layer 2 is formed on the template substrate 1 that was subject to the heat treatment.

First, the template substrate 1 is placed at a specific position in an MOCVD apparatus and heated at a temperature of about 1000° C. to about 1100° C., while only hydrogen gas is supplied. After the temperature is maintained for several minutes, hydrogen gas and ammonia gas are further supplied, and the supply is maintained for several minutes. The temperature rise process is performed to remove the surface oxide film formed on the surface of the template substrate 1.

The AlGaN layer 2 having a superlattice structure is then formed, while the template substrate 1 is kept at a temperature higher than 1000° C.

Specifically, several tens to several hundreds of alternating layers of the first unit layer 2a and the second unit layer 2b each with a thickness of several to tens nanometers are laminated, in which the first unit layer 2a includes a Group III nitride represented by the composition formula $Al_xGa_{1-x}N$ ($0 \leq x \leq 1$), and the second unit layer 2b includes a Group III nitride represented by the composition formula $Al_yGa_{1-y}N$ ($0 \leq y \leq 1$, $y \neq x$). When each layer is formed, TMA (trimethylaluminum) and TMG (trimethylgallium) may be each supplied at a specific flow rate depending on the composition of each layer together with hydrogen carrier gas, and ammonia gas may be supplied at a flow rate appropriate to the flow rate thereof.

For example, when an AlN layer may be formed as the first unit layer 2a, and an $Al_{0.6}Ga_{0.4}N$ layer may be formed as the second unit layer 2b, TMA may be supplied at a flow rate of 11 μmol/minute to form the former, and TMA and TMG may be supplied at a flow rate of 11 μmol/minute and a flow rate of 16 μmol/minute, respectively, to form the latter.

The AlGaN layer 2 formed as described above has a mirror surface with no cracks observed and also has good surface flatness at such a level that its surface roughness ra is several nanometers.

Figure 2A:
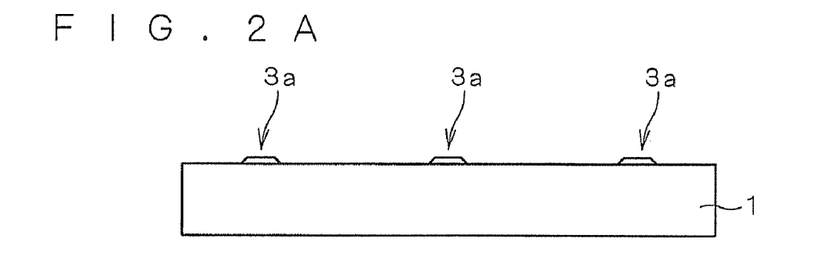
FIGS. 2A to 2D are schematic diagrams showing a process through which an AlGaN layer 2 is formed.
Figure 2B:
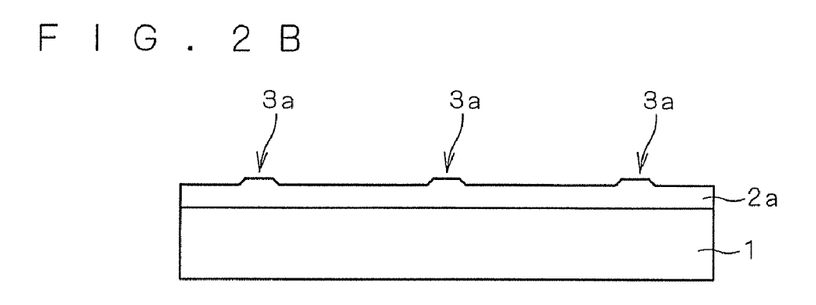
Figure 2C:
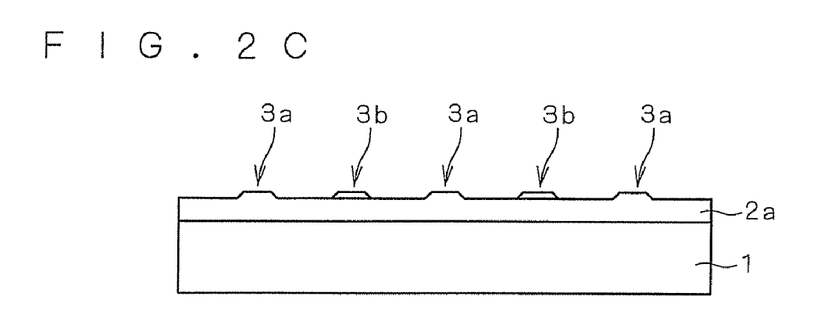
Figure 2D:
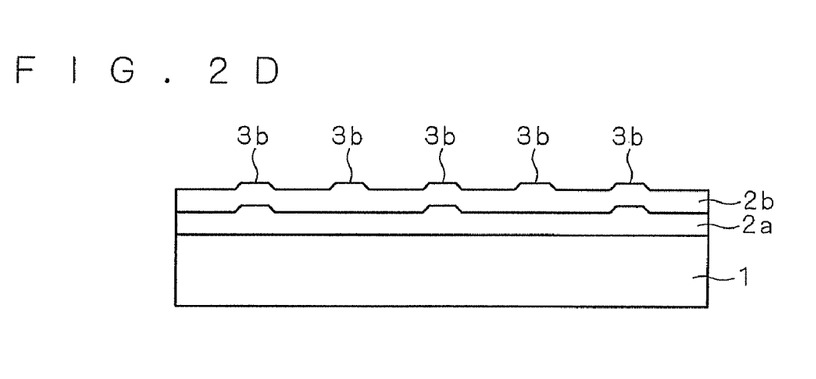
Figure 3A:
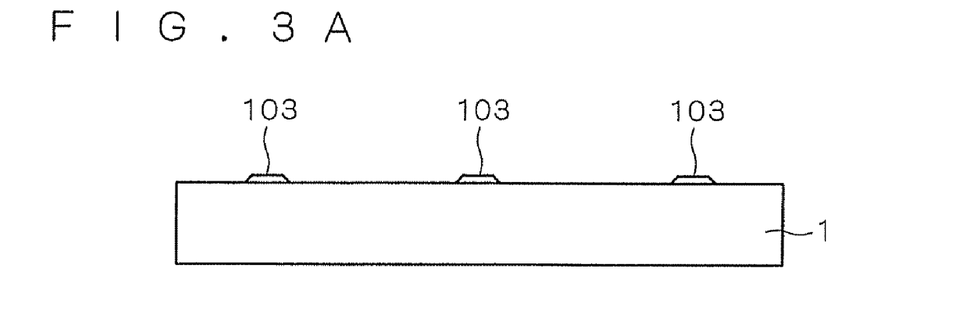
FIGS. 3A to 3C are schematic diagrams showing a case where a crystal layer of AlGaN is continuously formed on a template substrate 1.
Figure 3B:
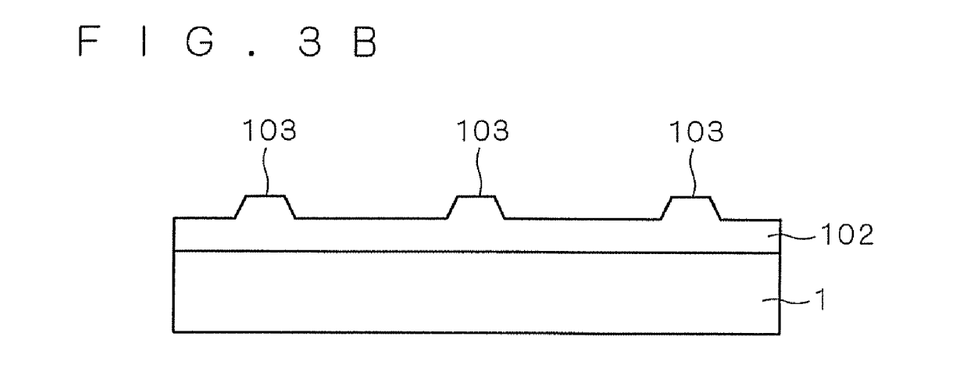
Figure 3C:
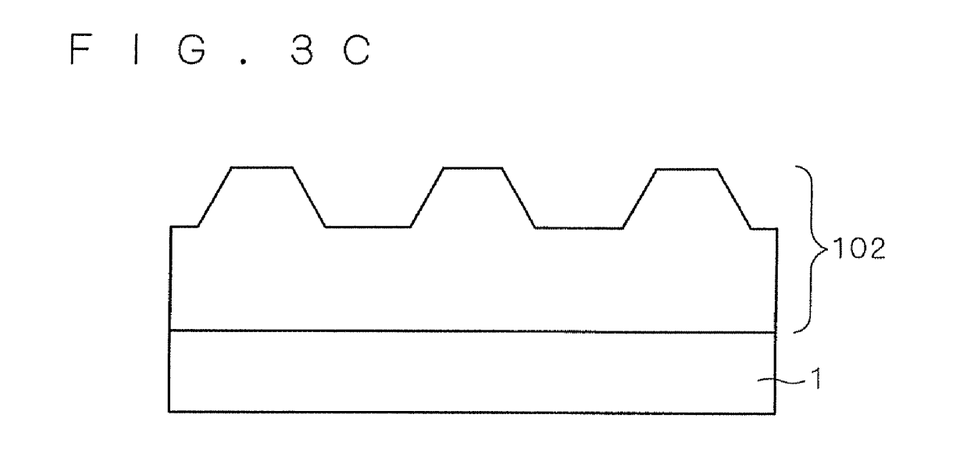

The efficacy of the superlattice structure-containing AlGaN layer 2 in the formation of a surface with good flatness is described here by comparing with the case of no superlattice structure. FIGS. 2A to 2D are schematic diagrams showing a process through which the AlGaN layer 2 is formed. FIGS. 3A to 3C are schematic diagrams showing, for comparison, a case where an AlGaN crystal layer is continuously formed (so as not to have any superlattice structure) on the template substrate 1.

The template substrate 1 is heated to a specific deposition temperature higher than 1000° C., and then the first unit layer 2a of a Group III nitride represented by the composition formula $Al_xGa_{1-x}N$ ($0 \leq x \leq 1$) is formed on the template substrate 1. In this process, the surface of the template substrate 1 has a substantially flatness at an atomic level and low dislocation density, so that the nuclei 3a are unevenly formed (FIG. 2A). The first unit layer 2a having the superlattice structure is formed with a thickness of at most several to tens of nanometers. Therefore, the process of forming the first unit layer 2a is ended after the surface of the template substrate 1 is completely covered but before the nuclei 3a sufficiently grow (FIG. 2B). As a result, the surface of the first unit layer 2a has substantially the same level of flatness as the template substrate 1.

Subsequently, the second unit layer 2b of a Group III nitride represented by the composition formula $Al_yGa_{1-y}N$ ($0 \leq y \leq 1$, $y \neq x$) is formed on the first unit layer 2a. In this process, the nuclei 3b are also unevenly formed (FIG. 2C). Therefore, the process of forming the second unit layer 2b is ended after the surface of the first unit layer 2a is completely covered but before the nuclei 3b sufficiently grow (FIG. 2D). Thereafter, the process of forming the first unit layer 2a and the second unit layer 2b is repeated in the same manner as described above. As a result, therefore, the AlGaN layer 2 is formed with good surface flatness.

On the other hand, a discussion is given of a case where, as illustrated in FIGS. 3A to 3C, a crystal layer 102 of a Group III nitride represented by the composition formula $Al_xGa_{1-x}N$ ($0 \leq x \leq 1$) is continuously formed to have a thickness substantially the same as the total thickness of the superlattice structure-containing AlGaN layer 2 on the template substrate 1 heated at a deposition temperature higher than 1000° C. In this case, at the initial deposition stage, the nuclei 103 are unevenly formed (FIG. 3A) in the same manner as in the case of the embodiment shown in FIG. 2A. Thereafter, however, the layer is continuously formed so that a difference in growth rate occurs between the portion where the nuclei 103 are formed at the initial stage and the other portion (FIG. 3B). As a result, only the crystal layer 102 (FIG. 3C) is obtained that has surface irregularities significantly larger than those of the AlGaN layer 2 that is formed to have a superlattice structure according to the embodiment.

As described above, according to the embodiment, an AlGaN layer is formed at a deposition temperature higher than 1000° C. so as to have a superlattice structure on a template substrate having a surface layer that is flat at a substantially atomic level, so that the resulting AlGaN layer has good surface flatness. Therefore, for example, devices having a high-Al-content AlGaN layer as a functional layer can be manufactured in a favorable manner.

EXAMPLES

Figure 4:
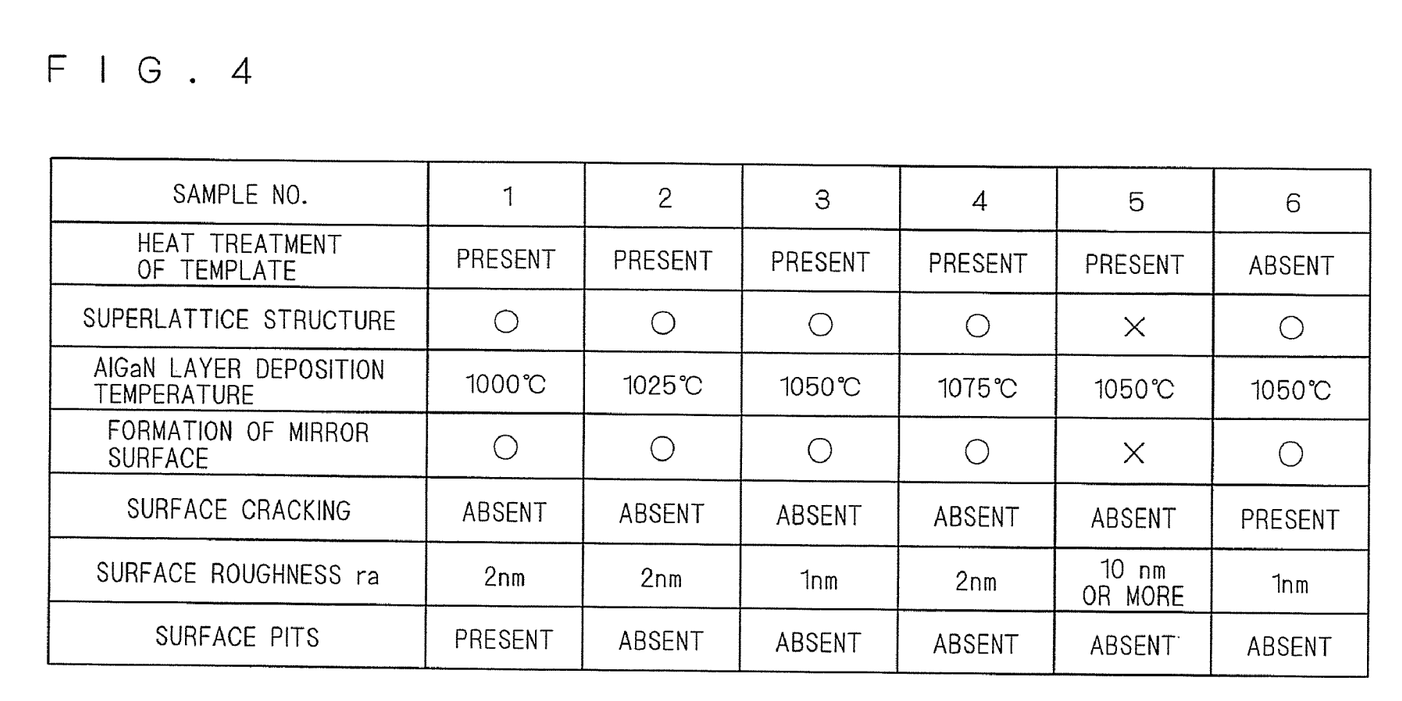
FIG. 4 is a list of preparation conditions and the results of the observation of the surface states of the resulting AlGaN layers with respect to the respective samples according to the examples.

In the examples, ten samples (Nos. 1 to 10) were prepared as described below, and the surfaces of the samples were observed. FIG. 4 shows a list of preparation conditions and the results of the observation of the surface states of the resulting AlGaN layers with respect to the samples (Nos. 1 to 10).

(No. 1)

An AlGaN layer having a superlattice structure was formed on a template substrate, and the surface thereof was observed.

A 400 μm-thick, c-plane, sapphire single crystal was provided as a base material. A 1 μm-thick AlN layer was epitaxially grown on the base material using an MOCVD apparatus, so that a template substrate was obtained. The template substrate was heat-treated at 1500° C. in nitrogen. It was then confirmed that in-plane compressive stress was applied to the surface layer after the heat treatment.

After the heat treatment, the template substrate was placed at a specific position in an MOCVD apparatus and heated to 1050° C., while only hydrogen gas was supplied. After the temperature was held for 6 minutes, hydrogen gas and ammonia gas were further supplied, and the supply was held for 5 minutes. This heat treatment was performed for a time period of 30 minutes, so that the surface oxide film was removed from the surface of the template substrate.

Thereafter, the temperature was kept at 1000° C., and TMA was supplied at a flow rate of 11 μmol/minute together with hydrogen carrier gas, while ammonia gas was supplied at a specific flow rate, so that an AlN layer with a thickness of 10 nm was formed as the first unit layer.

Subsequently, TMA and TMG were supplied at a flow rate of 11 μmol/minute and a flow rate of 16 μmol/minute, respectively, while ammonia gas was supplied at a specific flow rate, so that an $Al_{0.6}Ga_{0.4}N$ layer with a thickness of 10 nm was formed as the second unit layer.

The process of forming the first and second unit layers was repeated 75 times so that a 1.5 μm-thick AlGaN layer having a superlattice structure was formed.

(No. 2)

An AlGaN layer was formed on a template substrate using the process of No. 1, except that the AlGaN layer was formed at a temperature of 1025° C.

(No. 3)

An AlGaN layer was formed on a template substrate using the process of No. 1, except that the AlGaN layer was formed at a temperature of 1050° C.

(No. 4)

An AlGaN layer was formed on a template substrate using the process of No. 1, except that the AlGaN layer was formed at a temperature of 1075° C.

(No. 5)

An AlGaN layer was formed on a template substrate using the process of No. 3, except that the AlGaN layer was continuously formed (so as not to have any superlattice structure).

In the process of forming the AlGaN layer, TMA and TMG were supplied at a flow rate of 11 μmol/minute and a flow rate of 16 μmol/minute, respectively, together with hydrogen carrier gas, while ammonia gas was supplied at a specific flow rate, so that a 1.8 μm-thick $Al_{0.6}Ga_{0.4}N$ layer was formed.

(No. 6)

An AlGaN layer was formed on a template substrate using the process of No. 3, except that the heat treatment of the template substrate was omitted.

(Comparison of Nos. 1 to 6)

As shown in FIG. 4, it was demonstrated that in each of Sample Nos. 2, 3 and 4, the surface of the AlGaN layer formed was a mirror surface with neither cracks nor pits observed, and it was flat at a substantially atomic level and had a surface roughness ra of 2 nm or less.

On the other hand, in Sample No. 5, hexagonal cylinder-shaped irregularities were observed on the surface, while no crack was observed. A comparison with Nos. 2 to 4 indicates that the process of forming the superlattice structure on the heat-treated template substrate is favorable for the formation of the AlGaN layer with good surface flatness.

On the other hand, in Sample No. 1, pits were observed, while the surface was a mirror surface with no cracks observed and had a surface roughness ra of 2 nm. A comparison with Nos. 2 to 4 indicates that a deposition temperature higher than 1000° C. is effective in forming a high-surface-flatness AlGaN layer.

In Sample No. 6, cracking was observed on the surface, while the surface was a mirror surface. A comparison with Nos. 2 to 4 indicates that the heat treatment for applying in-plane compressive stress to the surface layer is effective in terms of suppressing cracks.

(No. 7)

An AlGaN layer was formed using the process of No. 1, except that a Si-doped region having n-type conductivity was formed by supplying $SiH_4$ at a specific feed rate in the process of forming the AlGaN layer.

The surface state of the resulting AlGaN layer was the same as that of Sample No. 1. The sheet resistance of the layer was measured to be 310Ω/□.

(No. 8)

An AlGaN layer was formed using the process of No. 2, except that a Si-doped region having n-type conductivity was formed by supplying $SiH_4$ at a specific feed rate in the process of forming the AlGaN layer.

The surface state of the resulting AlGaN layer was the same as that of Sample No. 2. The sheet resistance of the layer was measured to be 80Ω/□.

(No. 9)

An AlGaN layer was formed using the process of No. 3, except that a Si-doped region having n-type conductivity was formed by supplying $SiH_4$ at a specific feed rate in the process of forming the AlGaN layer.

The surface state of the resulting AlGaN layer was the same as that of Sample No. 3. The sheet resistance of the layer was measured to be 90Ω/□.

(No. 10)

An AlGaN layer was formed using the process of No. 4, except that a Si-doped region having n-type conductivity was formed by supplying $SiH_4$ at a specific feed rate in the process of forming the AlGaN layer.

The surface state of the resulting AlGaN layer was the same as that of Sample No. 4. The sheet resistance of the layer was measured to be 226Ω/□.

Thus, it was demonstrated that the AlGaN layer of each of Sample Nos. 7 and 10 had good surface flatness at substantially the same level as that of Sample No. 8 or 9 but had an electrical conductivity lower than that of Sample No. 8 or 9.

The invention claimed is:

1. A method of forming an AlGaN crystal layer, comprising the steps of:
    fabricating a template substrate by forming an AlN crystal layer on a specific single crystal base material, said template substrate fabrication step comprising the steps of
        epitaxially forming the AlN crystal layer on said single crystal base material, and
        then performing a step of heating said AlN crystal layer to a temperature of 1500° C. or higher, so that said AlN crystal layer, after said heating, exhibits in-plane compressive stress and has a flat surface at a substantially atomic level; and
    then forming an AlGaN layer on said AlN crystal layer after completing the heating step;
    wherein said AlGaN layer is formed at a deposition temperature higher than 1000° C. by depositing alternating layers of a first unit layer comprising a Group III nitride represented by the composition formula $Al_xGa_{1-x}N$ ($0 \leq x \leq 1$) and a second unit layer comprising a Group III nitride represented by the composition formula $Al_yGa_{1-y}N$ ($0 \leq y \leq 1$ and $y \neq x$) such that the AlGaN layer has a superlattice structure.

2. The method of forming an AlGaN crystal layer according to claim 1, wherein, in the step of forming said AlGaN layer, said first unit layer and the second unit layer are each formed with a thickness in such a range that no lattice relaxation occurs.

3. The method of forming an AlGaN crystal layer according to claim 1, wherein in the step of forming said AlGaN layer, said AlGaN layer is formed at a deposition temperature lower than 1100° C.

4. The method of forming an AlGaN crystal layer according to claim 3, wherein in the step of forming said AlGaN layer, said AlGaN layer is formed at a deposition temperature of 1025° C. or higher and 1075° C. or lower.

5. The method of forming an AlGaN crystal layer according to claim 4, wherein in the step of forming said AlGaN layer, said AlGaN layer is formed at a deposition temperature of 1040° C. or higher and 1060° C. or lower.

6. The method of forming an AlGaN crystal layer according to claim 1, wherein in the step of forming said AlGaN layer, said AlGaN layer is formed by depositing alternating layers of said first unit layer and said second unit layer, while a specific dopant is introduced, so that said AlGaN layer formed has electrical conductivity.

7. The method of forming an AlGaN crystal layer according to claim 1, wherein said first unit layer comprises a Group III nitride represented by the composition formula $Al_xGa_{1-x}N$ ($0.5 < x \leq 1$), and said second unit layer comprises a Group III nitride represented by the composition formula $Al_yGa_{1-y}N$ ($0.5 \leq y < 1$ and $y < x$).

8. The method of forming an AlGaN crystal layer according to claim 7, wherein said first unit layer comprises AlN.

9. The method of forming an AlGaN crystal clear according to claim 1, wherein said AlGaN crystal clear is formed by depositing several tens to several hundreds of alternating layers of said first unit layer and said second unit layer, each deposited layer having a thickness of several to tens of nanometers.

\* \* \* \* \*

UNITED STATES PATENT AND TRADEMARK OFFICE
CERTIFICATE OF CORRECTION

PATENT NO. : 7,713,847 B2  
APPLICATION NO. : 12/051168  
DATED : May 11, 2010  
INVENTOR(S) : Kei Kosaka, Shigeaki Sumiya and Tomohiko Shibata

It is certified that error appears in the above-identified patent and that said Letters Patent is hereby corrected as shown below:

Column 10

*Lines 60 and 61:* please change "clear" to --layer--

Signed and Sealed this

Third Day of August, 2010

David J. Kappos  
*Director of the United States Patent and Trademark Office*